United States Patent
Murase

(10) Patent No.: US 10,411,672 B2
(45) Date of Patent: Sep. 10, 2019

(54) ELASTIC WAVE DEVICE

(71) Applicant: Murata Manufacturing Co., Ltd., Nagaokakyo-shi, Kyoto-fu (JP)

(72) Inventor: Tomohiko Murase, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 99 days.

(21) Appl. No.: 15/617,061

(22) Filed: Jun. 8, 2017

(65) Prior Publication Data

US 2017/0373667 A1 Dec. 28, 2017

(30) Foreign Application Priority Data

Jun. 27, 2016 (JP) .................................. 2016-126547

(51) Int. Cl.
| | |
|---|---|
| H03H 9/02 | (2006.01) |
| H03H 9/64 | (2006.01) |
| H01L 41/187 | (2006.01) |
| H03H 9/05 | (2006.01) |
| H03H 9/145 | (2006.01) |
| H03H 9/25 | (2006.01) |
| H03H 9/10 | (2006.01) |

(52) U.S. Cl.
CPC ..... *H03H 9/02992* (2013.01); *H01L 41/1873* (2013.01); *H03H 9/02637* (2013.01); *H03H 9/059* (2013.01); *H03H 9/1071* (2013.01); *H03H 9/14541* (2013.01); *H03H 9/25* (2013.01); *H03H 9/64* (2013.01)

(58) Field of Classification Search
CPC ...... H03H 9/64; H03H 9/059; H03H 9/02992; H03H 9/1071; H03H 9/14541; H03H 9/25; H03H 9/02637; H01L 41/1873

USPC .......................................... 333/133, 193–196
See application file for complete search history.

(56) References Cited

U.S. PATENT DOCUMENTS

2008/0266023 A1* 10/2008 Tanaka ................. H03H 9/0576
333/133
2012/0279795 A1* 11/2012 Furukawa .......... H03H 9/02992
181/139

(Continued)

FOREIGN PATENT DOCUMENTS

| JP | 05-167387 A | 7/1993 |
|---|---|---|
| WO | 2014/171369 A1 | 10/2014 |
| WO | 2016/063738 A1 | 4/2016 |

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave device includes a piezoelectric substrate, IDT electrodes disposed on the piezoelectric substrate, a first wiring line, an insulating layer covering at least a portion of the first wiring line, a second wiring line at least a portion of which is disposed on the insulating layer to provide a three-dimensional crossing portion, a peripheral support including a cavity surrounding the IDT electrodes, the first and second wiring lines, and the insulating layer, a partition support disposed in the cavity, and a cover disposed on the peripheral support and the partition support to cover the cavity. The second wiring line includes a step portion electrically connecting a portion of the second wiring line located on the piezoelectric substrate and a portion of the second wiring line located on the insulating layer to each other. The partition support covers the step portion.

16 Claims, 5 Drawing Sheets

(56) References Cited

U.S. PATENT DOCUMENTS

| | | | |
|---|---|---|---|
| 2015/0155853 A1* | 6/2015 | Toyota | H03H 9/02897 333/193 |
| 2016/0036410 A1 | 2/2016 | Tsuda | |
| 2017/0155372 A1 | 6/2017 | Kikuchi et al. | |

* cited by examiner

ELASTIC WAVE DEVICE

CROSS REFERENCE TO RELATED APPLICATIONS

This application claims the benefit of priority to Japanese Patent Application No. 2016-126547 filed on Jun. 27, 2016. The entire contents of this application are hereby incorporated herein by reference.

BACKGROUND OF THE INVENTION

1. Field of the Invention

The present invention relates to an elastic wave device that includes a three-dimensional crossing portion, in which wiring lines three-dimensionally cross each other, and that has a wafer level package (WLP) structure.

2. Description of the Related Art

In the related art, elastic wave devices have been widely used as, for example, filters of cellular phones. In an elastic wave device that includes a plurality of surface acoustic wave elements, interdigital transducer (IDT) electrodes formed on a piezoelectric substrate are electrically connected to each other by wiring lines, and a filter circuit and the like are provided. In this case, in order to provide a reduction in the size of the elastic wave device, the plurality of wiring lines may sometimes three-dimensionally cross each other.

For example, as in Japanese Unexamined Patent Application Publication No. 5-167387, an upper wiring line is provided above a lower wiring line with an insulating layer interposed therebetween in a three-dimensional crossing portion.

In a WLP structure, a hollow space is provided and defined by a piezoelectric substrate, a support, and a cover. In the case where an elastic wave device includes a three-dimensional crossing portion, the thickness of the three-dimensional crossing portion is larger than those of other wiring portions. Accordingly, the distance between wiring lines in the three-dimensional crossing portion and the cover is short. Consequently, a problem such as breakage of the wiring lines sometimes occurs as a result of the cover coming into contact with the upper wiring line in the three-dimensional crossing portion.

Here, providing a partition support on the three-dimensional crossing portion may be considered in order to significantly reduce or prevent contact between the cover and the upper wiring line in the three-dimensional crossing portion. However, the coefficient of linear expansion of the partition support and the coefficient of linear expansion of the upper wiring line in the three-dimensional crossing portion are different from each other. Thus, if the partition support is disposed on the three-dimensional crossing portion, there is a possibility that breakage of the wiring lines due to a heat load will occur.

SUMMARY OF THE INVENTION

Preferred embodiments of the present invention provide elastic wave devices in which breakage of wiring lines in a three-dimensional crossing portion is significantly reduced or prevented.

An elastic wave device according to a preferred embodiment of the present invention includes a piezoelectric substrate, an interdigital transducer (IDT) electrode that is disposed on the piezoelectric substrate, a first wiring line that is electrically connected to the IDT electrode and disposed on the piezoelectric substrate, an insulating layer that is disposed on the piezoelectric substrate and that covers at least a portion of the first wiring line, a second wiring line that is disposed on the piezoelectric substrate, at least a portion of the second wiring line being disposed on the insulating layer to provide a three-dimensional crossing portion, a peripheral support that is disposed on the piezoelectric substrate and that has a cavity surrounding the IDT electrode, the first and second wiring lines, and the insulating layer, a partition support that is disposed on the piezoelectric substrate and positioned in the cavity, and a cover that is disposed on the peripheral support and the partition support to cover the cavity. The second wiring line includes a step portion that electrically connects a portion of the second wiring line located on the piezoelectric substrate and a portion of the second wiring line located on the insulating layer to each other, and the partition support covers the step portion.

In an elastic wave device according to a preferred embodiment of the present invention, the partition support covers the portion of the second wiring line located on the insulating layer. In this case, breakage of the second wiring line is further significantly reduced or prevented.

In an elastic wave device according to another preferred embodiment of the present invention, the partition support covers the insulating layer. In this case, breakage of the second wiring line is able to be significantly reduced or prevented.

An elastic wave device according to another preferred embodiment of the present invention further includes a plurality of the IDT electrodes and a first and second longitudinally coupled resonator elastic wave filters that include the plurality of IDT electrodes. The three-dimensional crossing portion is positioned between the first longitudinally coupled resonator elastic wave filter and the second longitudinally coupled resonator elastic wave filter.

In an elastic wave device according to another preferred embodiment of the present invention, a plurality of the three-dimensional crossing portions are provided. The plurality of three-dimensional crossing portions are located at different positions in or substantially in a direction in which an electrode finger of the IDT electrode extends. When a direction crossing the partition support is a width direction, the partition support includes large width portions each having a width larger than a width of each of other portions of the partition support to cover a plurality of the step portions in the plurality of three-dimensional crossing portions. In this case, the cover is able to be supported with higher certainty, and the strength of the elastic wave device is able to be increased.

In an elastic wave device according to another preferred embodiment of the present invention, a plurality of the three-dimensional crossing portions are provided. The plurality of three-dimensional crossing portions are located at different positions in or substantially in a direction in which an electrode finger of the IDT electrode extends. When a direction crossing the partition support is a width direction, a width of the partition support is set to a width that enables the partition support to cover a plurality of the step portions in the plurality of three-dimensional crossing portions. In this case, the strength of the elastic wave device is able to be further increased.

In an elastic wave device according to another preferred embodiment of the present invention, a plurality of the three-dimensional crossing portions are provided. The plurality of three-dimensional crossing portions are located at different positions in or substantially in a direction in which an electrode finger of the IDT electrode extends and are located at different positions in an elastic wave propagation direction. The partition support extends in or substantially in a direction obliquely crossing the direction in which the electrode finger of the IDT electrode extends to cover a plurality of the step portions in the plurality of three-dimensional crossing portions. In this case, breakage of the second wiring line is able to be significantly reduced or prevented without unnecessarily increasing a contact area between the partition support and the cover. Therefore, the occurrence of a problem such as generation of air bubbles in a portion where the partition support and the cover are in contact with each other is able to be significantly reduced or prevented.

In an elastic wave device according to another preferred embodiment of the present invention, a plurality of the three-dimensional crossing portions are provided. The plurality of three-dimensional crossing portions are located at different positions in or substantially in a direction in which an electrode finger of the IDT electrode extends. The partition support is bent when viewed in plan view to cover a plurality of the step portions in the plurality of three-dimensional crossing portions. In this case, the occurrence of a problem such as generation of air bubbles in a portion where the partition support and the cover are in contact with each other is able to be significantly reduced or prevented.

According to the preferred embodiments of the present invention, elastic wave devices in which breakage of wiring lines in a three-dimensional crossing portion is significantly reduced or prevented are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention are described below with reference to the drawings to clarify the present invention.

Note that the preferred embodiments described in the present specification are examples, and it is to be noted that the configurations according to the different preferred embodiments may be partially replaced with one another or may be combined with each other.

First Preferred Embodiment

Figure 1:
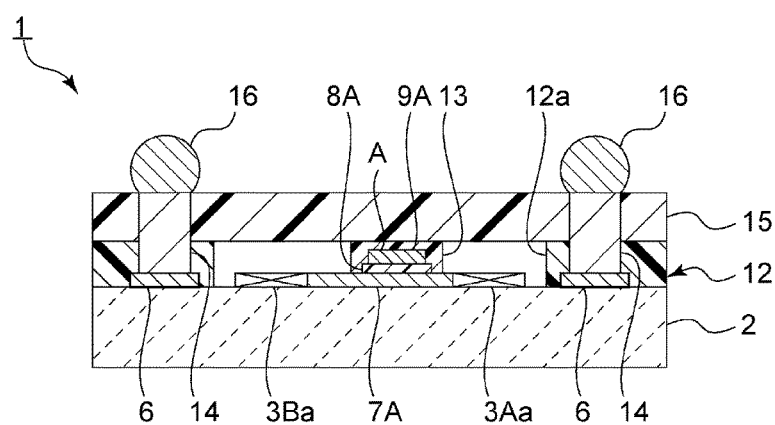
FIG. 1 is a schematic sectional front view of an elastic wave device according to a first preferred embodiment of the present invention.
Figure 2:
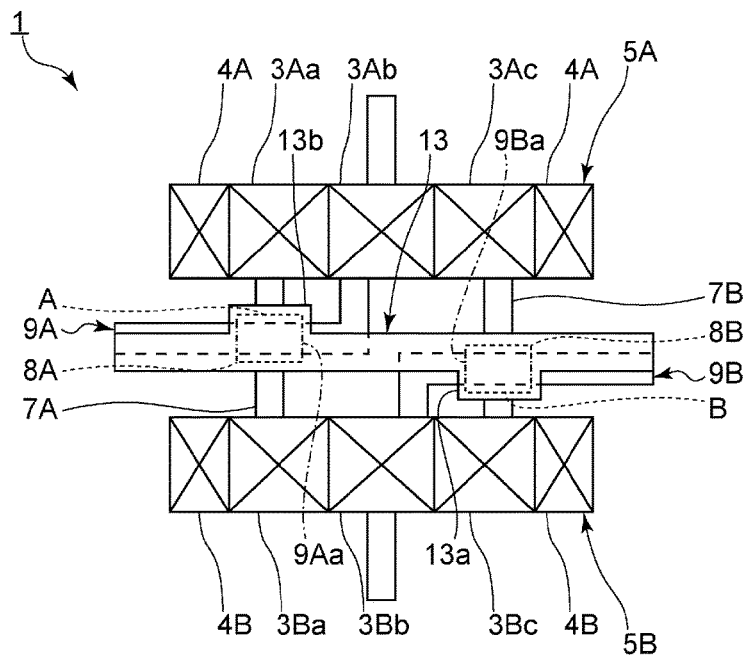
FIG. 2 is a schematic plan view showing the electrode structure of the elastic wave device according to the first preferred embodiment of the present invention.

FIG. 1 is a schematic sectional front view of an elastic wave device according to a first preferred embodiment of the present invention. FIG. 2 is a schematic plan view showing the electrode structure of the elastic wave device according to the first preferred embodiment. In FIG. 1 and FIG. 2, interdigital transducer (IDT) electrodes, which are described below, are schematically shown by blocks, each of which is defined by connecting the two diagonal lines of a rectangular or substantially rectangular frame. In FIG. 2, reflectors, which are described below, are schematically shown by blocks, each of which is defined by connecting the two diagonal lines of a rectangular or substantially rectangular frame, and a piezoelectric substrate and electrode lands are not shown.

As shown in FIG. 1, an elastic wave device 1 includes a piezoelectric substrate 2. The piezoelectric substrate 2 preferably is made of, for example, a piezoelectric single crystal, such as $LiTaO_3$ or $LiNbO_3$, or a suitable piezoelectric ceramic.

A plurality of IDT electrodes 3Aa and 3Ba and a plurality of electrode lands 6 are disposed on the piezoelectric substrate 2. As shown in FIG. 2, the elastic wave device 1 also includes a plurality of IDT electrodes 3Ab, 3Ac, 3Bb, and 3Bc. Reflectors 4A and 4A are disposed at the ends of the IDT electrodes 3Aa to 3Ac in or substantially in an elastic wave propagation direction. Thus, a first longitudinally coupled resonator elastic wave filter 5A is provided. Similarly, reflectors 4B and 4B are disposed at the ends of the IDT electrodes 3Ba to 3Bc in or substantially in the elastic wave propagation direction. Thus, a second longitudinally coupled resonator elastic wave filter 5B is provided.

In the first preferred embodiment, although each of the first and second longitudinally coupled resonator elastic wave filters 5A and 5B preferably is a three-IDT longitudinally coupled resonator elastic wave filter, the number of the IDT electrodes included in each of the first and second longitudinally coupled resonator elastic wave filters 5A and 5B is not particularly limited.

A plurality of first wiring lines 7A and 7B are disposed on the piezoelectric substrate 2. The first wiring lines 7A and 7B are wiring lines electrically connecting the first and second longitudinally coupled resonator elastic wave filters 5A and 5B to each other. More specifically, the first wiring line 7A electrically connects the IDT electrode 3Aa and the IDT electrode 3Ba to each other. The first wiring line 7B electrically connects the IDT electrode 3Ac and the IDT electrode 3Bc to each other.

An insulating layer 8A indicated by a dashed line is disposed on the piezoelectric substrate 2 to cover at least a portion of the first wiring line 7A. In addition, a second wiring line 9A is disposed on the piezoelectric substrate 2, and at least a portion of the second wiring line 9A is positioned above the first wiring line 7A with the insulating layer 8A located therebetween. Thus, a three-dimensional crossing portion A is provided. The second wiring line 9A includes a step portion 9Aa that is indicated by a chain line in FIG. 2 and that electrically connects a portion of the second wiring line 9A located on the piezoelectric substrate 2 and a portion of the second wiring line 9A located on the insulating layer 8A to each other.

Similarly, a second wiring line 9B is indirectly disposed on the first wiring line 7B with an insulating layer 8B located therebetween, and, thus, a three-dimensional crossing portion B is provided. The second wiring line 9B also includes a step portion 9Ba. In the first preferred embodiment, the plurality of three-dimensional crossing portions A and B are positioned between the first longitudinally coupled resonator elastic wave filter 5A and the second longitudinally coupled resonator elastic wave filter 5B.

Note that, although not shown in FIG. 2, an end portion of the IDT electrode 3Aa, the end portion being opposite to an end portion of the IDT electrode 3Aa that is located on the side on which the first wiring line 7A is disposed, is electrically connected to a ground potential. Similarly, an end portion of the IDT electrode 3Ba, the end portion being opposite to an end portion of the IDT electrode 3Ba that is located on the side on which the first wiring line 7A is disposed, is electrically connected to a ground potential, and end portions of the IDT electrodes 3Ac and 3Bc, the end portions being opposite to end portions of the IDT electrodes 3Ac and 3Bc that are located on the side on which the first wiring line 7B is disposed, are electrically connected to a ground potential.

Although schematically shown in FIG. 2, a direction in which electrode fingers of the IDT electrodes 3Aa to 3Ac and 3Ba to 3Bc extend corresponds to a vertical or substantially vertical direction in FIG. 2. The plurality of three-dimensional crossing portions A and B are located at different positions in or substantially in the direction in which the electrode fingers of the IDT electrodes 3Aa to 3Ac and 3Ba to 3Bc extend. In addition, the plurality of three-dimensional crossing portions A and B are located at different positions in or substantially in the elastic wave propagation direction. Note that the positions of the three-dimensional crossing portions A and B are not limited to these particular positions. Preferably, least one three-dimensional crossing portion is provided, for example.

As shown in FIG. 1, a peripheral support 12 is disposed on the piezoelectric substrate 2. The peripheral support 12 includes a cavity 12a surrounding the first and second longitudinally coupled resonator elastic wave filters 5A and 5B, the first wiring lines 7A and 7B, the second wiring lines 9A and 9B, and the insulating layers 8A and 8B, which are shown in FIG. 2.

A partition support 13 is disposed on the piezoelectric substrate 2 and positioned in the cavity 12a. As shown in FIG. 2, the partition support 13 extends in or substantially in the elastic wave propagation direction. Here, a direction crossing the partition support 13 is a width direction. In this case, the partition support 13 includes large width portions 13a and 13b each having a width larger than that of each of the other portions of the partition support 13. The large width portion 13b of the partition support 13 covers the insulating layer 8A in the three-dimensional crossing portion A. Similarly, the large width portion 13a of the partition support 13 covers the insulating layer 8B in the three-dimensional crossing portion B. Accordingly, the partition support 13 covers the entire insulating layers 8A and 8B. Note that the partition support 13 may cover at least the step portions 9Aa and 9Ba of the second wiring lines 9A and 9B, for example.

Returning to FIG. 1, a cover 15 is disposed on the peripheral support 12 and the partition support 13 to cover the cavity 12a. A hollow space is provided and defined by the piezoelectric substrate 2, the peripheral support 12, and the cover 15. Accordingly, the elastic wave device 1 includes a WLP structure.

A plurality of via electrodes 14 extend through the cover 15 and the peripheral support 12. First end portions of the via electrodes 14, the first end portions being located on the side of the peripheral support 12 on which the piezoelectric substrate 2 is disposed, are electrically connected to corresponding ones of the electrode lands 6. Note that the electrode lands 6 are electrically connected to the first and second longitudinally coupled resonator elastic wave filters 5A and 5B, which are shown in FIG. 2.

Bumps 16 are bonded to second end portions of the via electrodes 14, the second end portions being located on the side of the cover 15 opposite to the side of the peripheral support 12 on which the piezoelectric substrate 2 is disposed. The elastic wave device 1 is mounted in or on, for example, a mounting substrate via the bumps 16. The first and second longitudinally coupled resonator elastic wave filters 5A and 5B are electrically connected to an exterior of the elastic wave device 1 via the electrode lands 6, the via electrodes 14, and the bumps 16.

As shown in FIG. 2, a feature of the first preferred embodiment is that the step portions 9Aa and 9Ba of the second wiring lines 9A and 9B are covered with the partition support 13. Accordingly, breakage of the second wiring lines 9A and 9B in the three-dimensional crossing portions A and B is able to be significantly reduced or prevented, as described below by comparing the first preferred embodiment and a comparative example.

Figure 3:
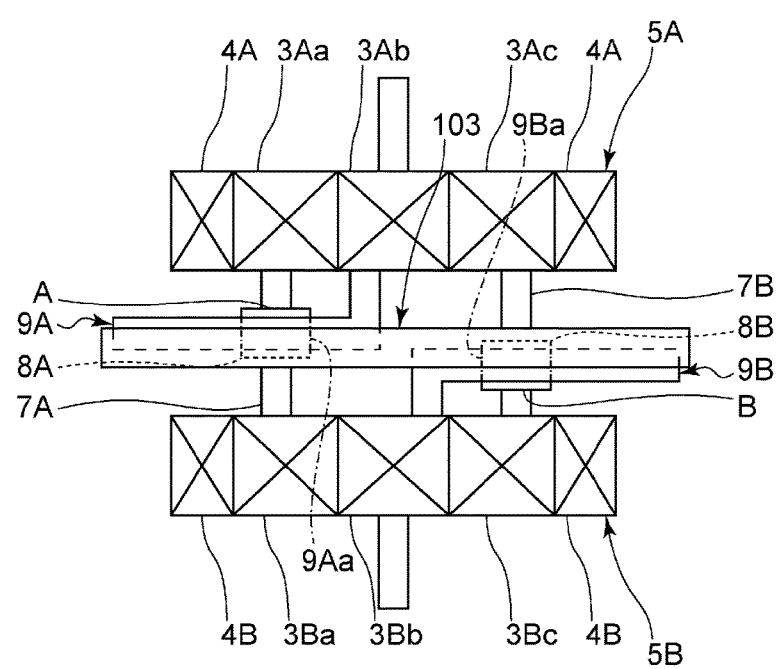
FIG. 3 is a schematic plan view showing the electrode structure of an elastic wave device according to a comparative example.
Figure 4:
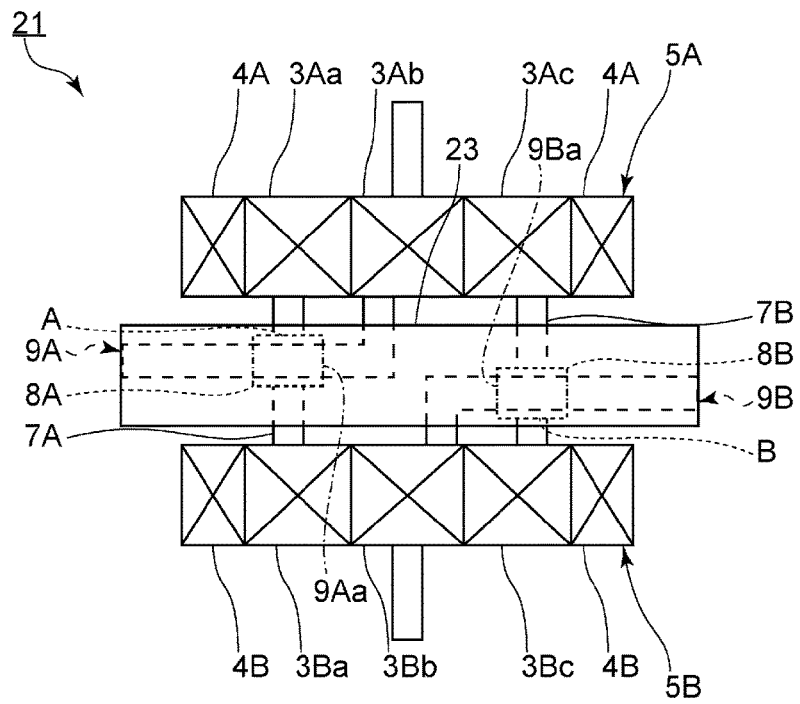
FIG. 4 is a schematic plan view showing the electrode structure of an elastic wave device according to a second preferred embodiment of the present invention.
Figure 5:
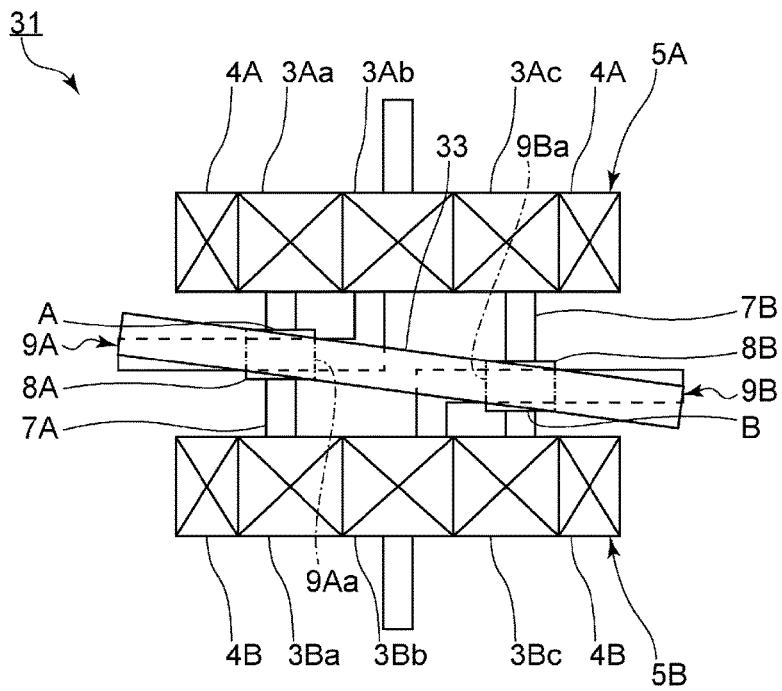
FIG. 5 is a schematic plan view showing the electrode structure of an elastic wave device according to a third preferred embodiment of the present invention.
Figure 6:
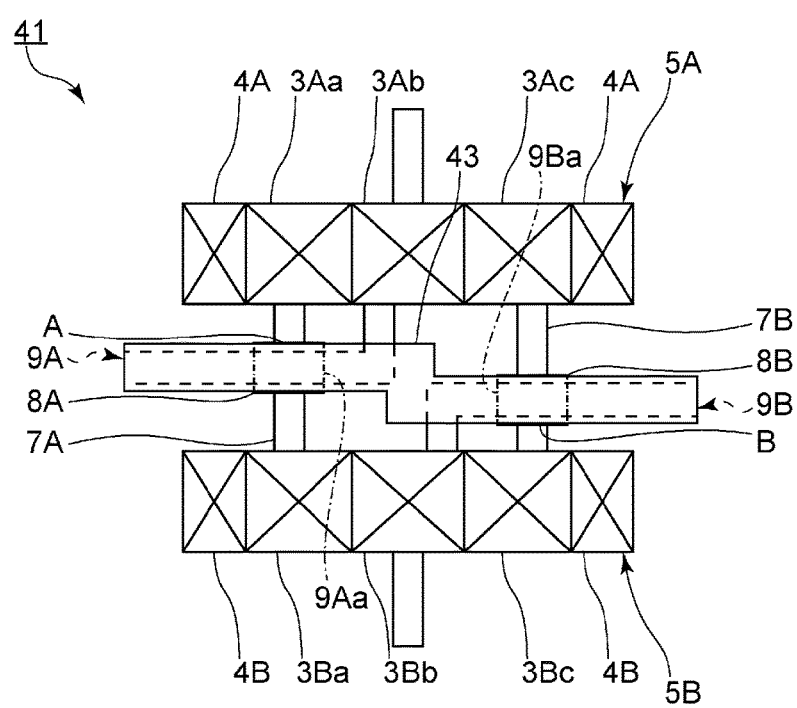
FIG. 6 is a schematic plan view showing the electrode structure of an elastic wave device according to a fourth preferred embodiment of the present invention.

FIG. 3 is a schematic plan view showing the electrode structure of an elastic wave device according to the comparative example. In FIG. 3, IDT electrodes and reflectors are schematically shown by blocks, each of which is provided by connecting the two diagonal lines of a rectangular or substantially rectangular frame, and a piezoelectric substrate and electrode lands are not shown. FIG. 4 to FIG. 6 include schematic elements that are the same as, or similar to, the schematic elements shown in FIG. 3, as described below.

One difference between the elastic wave device according to the comparative example and the elastic wave device 1 according to the first preferred embodiment is that a partition support 103 partially covers the step portions 9Aa and 9Ba of the second wiring lines 9A and 9B. In this case, in each of the second wiring lines 9A and 9B, there is a major difference in the amounts of expansion and contraction upon application of a heat load between a portion that is covered with the partition support 103 and a portion that is not covered with the partition support 103. Accordingly, the second wiring lines 9A and 9B are likely to break. In particular, breakage of the second wiring lines 9A and 9B is likely to occur in the step portions 9Aa and 9Ba.

On the other hand, in the first preferred embodiment shown in FIG. 2, the entire step portions 9Aa and 9Ba are covered with the partition support 13. Therefore, the second wiring lines 9A and 9B are less likely to break upon application of a heat load. In addition, since the partition support 13 is positioned above the three-dimensional crossing portions A and B, the second wiring lines 9A and 9B are less likely to come into contact with the cover 15, which is shown in FIG. 1. Therefore, breakage of the second wiring lines 9A and 9B is able to be significantly reduced or prevented.

Preferably, the portions of the second wiring lines 9A and 9B, that is, the portions located on the insulating layers 8A and 8B, are entirely covered with the partition support 13, for example. Accordingly, in the second wiring lines 9A and 9B, the amounts of expansion and contraction upon application of a heat load is able to be made further uniform. Therefore, breakage of the second wiring lines 9A and 9B is further significantly reduced or prevented.

Preferably, the partition support 13 covers the entire insulating layers 8A and 8B as in the first preferred embodiment, for example. Accordingly, in the second wiring lines 9A and 9B, the amounts of expansion and contraction upon application of a heat load is able to be made further uniform. Therefore, breakage of the second wiring lines 9A and 9B is able to be significantly reduced or prevented.

In addition, in the first preferred embodiment, since the partition support 13 includes the large width portions 13a and 13b, the cover 15 is able to be supported with higher certainty, and the strength of the elastic wave device 1 is able to be increased.

In the first preferred embodiment, although the first and second longitudinally coupled resonator elastic wave filters 5A and 5B are provided, the elastic wave device 1 does not need to include a longitudinally coupled resonator elastic wave filter, and the circuit configuration thereof is not particularly limited.

Second Preferred Embodiment

FIG. 4 is a schematic plan view showing the electrode structure of an elastic wave device according to a second preferred embodiment of the present invention.

One difference between an elastic wave device 21 according to the second preferred embodiment and the elastic wave device 1 according to the first preferred embodiment is that a partition support 23 includes a width that covers the step portions 9Aa and 9Ba in the three-dimensional crossing portions A and B. The configuration of the elastic wave device 21, excluding the specific features and elements described above, is similar to or the same as that of the elastic wave device 1 according to the first preferred embodiment.

Also, breakage of the second wiring lines 9A and 9B is significantly reduced or prevented. In addition, a cover is able to be supported with higher certainty, and thus, the strength of the elastic wave device 21 is able to be further increased.

Third Preferred Embodiment

FIG. 5 is a schematic plan view showing the electrode structure of an elastic wave device according to a third preferred embodiment of the present invention.

One difference between an elastic wave device 31 according to the third preferred embodiment and the elastic wave device 1 according to the first preferred embodiment is that a partition support 33 extends linearly or substantially linearly in a direction obliquely crossing the direction in which the electrode fingers of the IDT electrodes 3Aa to 3Ac and 3Ba to 3Bc extend and that the partition support 33 does not include a large width portion. In addition, another difference between the elastic wave device 31 and the elastic wave device 1 according to the first preferred embodiment is that the partition support 33 partially covers the insulating layers 8A and 8B. The configuration of the elastic wave device 31, excluding the specific features and elements described above, is similar to or the same as that of the elastic wave device 1 according to the first preferred embodiment.

Also in the third preferred embodiment, breakage of the second wiring lines 9A and 9B is significantly reduced or prevented. In addition, the partition support 33 has a linear or substantially linear shape and is able to be easily provided. Note that the shape of the partition support 33 is not limited to a linear or substantially linear shape. For example, similar to or the same as the first preferred embodiment, the partition support 33 may include a large width portion, for example.

In the elastic wave device 31, the breakage of the wiring lines is able to be significantly reduced or prevented without unnecessarily increasing a contact area between the partition support 33 and a cover. Therefore, the occurrence of a problem such as generation of air bubbles in a portion where the partition support 33 and the cover are in contact with each other is able to be significantly reduced or prevented.

Fourth Preferred Embodiment

FIG. 6 is a schematic plan view showing the electrode structure of an elastic wave device according to a fourth preferred embodiment of the present invention.

One difference between an elastic wave device 41 according to the fourth preferred embodiment and the elastic wave device 31 according to the third preferred embodiment is that a partition support 43 is bent when viewed in plan view. The configuration of the elastic wave device 41, excluding the specific features and elements described above, is similar to or the same as that of the elastic wave device 31 according to the third preferred embodiment.

Also in the fourth preferred embodiment, breakage of the second wiring lines 9A and 9B is significantly reduced or prevented. In addition, similar to the third preferred embodiment, the occurrence of a problem such as generation of air bubbles in a portion where the partition support 43 and a cover are in contact with each other is able to be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric substrate;
    an interdigital transducer (IDT) electrode that is disposed on the piezoelectric substrate;
    a first wiring line that is connected to the IDT electrode and disposed on the piezoelectric substrate;
    an insulating layer that is disposed on the piezoelectric substrate and that covers at least a portion of the first wiring line;
    a second wiring line that is disposed on the piezoelectric substrate, at least a portion of the second wiring line being positioned above the first wiring line with the insulating layer located between the second wiring line and the first wiring line to provide a three-dimensional crossing portion;
    a peripheral support that is disposed on the piezoelectric substrate and that includes a cavity surrounding the IDT electrode, the first and second wiring lines, and the insulating layer;
    a partition support that is disposed on the piezoelectric substrate and positioned in the cavity; and
    a cover that is disposed on the peripheral support and the partition support to cover the cavity; wherein the second wiring line includes a step portion that connects a portion of the second wiring line located on the piezoelectric substrate and a portion of the second wiring line located on the insulating layer to each other;

the partition support covers the step portion;

a plurality of the three-dimensional crossing portions are provided;

the plurality of three-dimensional crossing portions are located at different positions in or substantially in a direction in which an electrode finger of the IDT electrode extends; and when a direction crossing the partition support is a width direction, the partition support includes large width portions each having a width larger than a width of each of other portions of the partition support to cover a plurality of the step portions in the plurality of three-dimensional crossing portions.

2. The elastic wave device according to claim 1, wherein the partition support covers the portion of the second wiring line located on the insulating layer.

3. The elastic wave device according to claim 2, wherein the partition support covers the insulating layer.

4. The elastic wave device according to claim 1, further comprising:

a plurality of the IDT electrodes; and a first and second longitudinally coupled resonator elastic wave filters that include the plurality of IDT electrodes; wherein the three-dimensional crossing portion is positioned between the first longitudinally coupled resonator elastic wave filter and the second longitudinally coupled resonator elastic wave filter.

5. The elastic wave device according to claim 4, wherein each of the first and second longitudinally coupled resonator elastic wave filters includes at least three IDT electrodes of the plurality of IDT electrodes.

6. The elastic wave device according to claim 4, wherein the first wiring line electrically connects the first and second longitudinally coupled resonator elastic wave filters to each other.

7. The elastic wave device according to claim 4, wherein the cavity surrounds the first and second longitudinally coupled resonator elastic wave filters.

8. The elastic wave device according to claim 1, wherein reflectors are provided at each end of the IDT electrode in or substantially in an elastic wave propagation direction.

9. The elastic wave device according to claim 1, wherein the piezoelectric substrate, the peripheral support, and the cover define a hollow space.

10. The elastic wave device according to claim 1, further comprising a plurality of electrode lands disposed on the piezoelectric substrate.

11. The elastic wave device according to claim 10, further comprising a plurality of via electrodes that each extend through the cover and peripheral support.

12. The elastic wave device according to claim 11, wherein an end of each of the plurality of via electrodes located on a side of the peripheral support is electrically connected to a corresponding one of the plurality of lands.

13. The elastic wave device according to claim 11, wherein an end of each of the plurality of via electrodes located on a side of the cover is electrically connected to a corresponding bump;

when the elastic wave device is mounted on a mounting substrate, the bumps electrically connect the elastic wave device to the mounting substrate.

14. The elastic wave device according to claim 1, wherein the piezoelectric substrate includes a piezoelectric single crystal.

15. An elastic wave device comprising:

a piezoelectric substrate;

an interdigital transducer (IDT) electrode that is disposed on the piezoelectric substrate;

a first wiring line that is connected to the IDT electrode and disposed on the piezoelectric substrate;

an insulating layer that is disposed on the piezoelectric substrate and that covers at least a portion of the first wiring line;

a second wiring line that is disposed on the piezoelectric substrate, at least a portion of the second wiring line being positioned above the first wiring line with the insulating layer located between the second wiring line and the first wiring line to provide a three-dimensional crossing portion;

a peripheral support that is disposed on the piezoelectric substrate and that includes a cavity surrounding the IDT electrode, the first and second wiring lines, and the insulating layer;

a partition support that is disposed on the piezoelectric substrate and positioned in the cavity; and a cover that is disposed on the peripheral support and the partition support to cover the cavity; wherein the second wiring line includes a step portion that connects a portion of the second wiring line located on the piezoelectric substrate and a portion of the second wiring line located on the insulating layer to each other;

the partition support covers the step portion;

a plurality of the three-dimensional crossing portions are provided;

the plurality of three-dimensional crossing portions are located at different positions in or substantially in a direction in which an electrode finger of the IDT electrode extends and are located at different positions in or substantially in an elastic wave propagation direction; and the partition support extends in or substantially in a direction obliquely crossing a direction in which the electrode finger of the IDT electrode extends to cover a plurality of the step portions in the plurality of three-dimensional crossing portions.

16. An elastic wave device comprising:

a piezoelectric substrate;

an interdigital transducer (IDT) electrode that is disposed on the piezoelectric substrate;

a first wiring line that is connected to the IDT electrode and disposed on the piezoelectric substrate;

an insulating layer that is disposed on the piezoelectric substrate and that covers at least a portion of the first wiring line;

a second wiring line that is disposed on the piezoelectric substrate, at least a portion of the second wiring line being positioned above the first wiring line with the insulating layer located between the second wiring line and the first wiring line to provide a three-dimensional crossing portion;

a peripheral support that is disposed on the piezoelectric substrate and that includes a cavity surrounding the IDT electrode, the first and second wiring lines, and the insulating layer;

a partition support that is disposed on the piezoelectric substrate and positioned in the cavity; and a cover that is disposed on the peripheral support and the partition support to cover the cavity; wherein the second wiring line includes a step portion that connects a portion of the second wiring line located on the piezoelectric substrate and a portion of the second wiring line located on the insulating layer to each other;

the partition support covers the step portion;

a plurality of the three-dimensional crossing portions are provided;

the plurality of three-dimensional crossing portions are located at different positions in or substantially in a direction in which an electrode finger of the IDT electrode extends; and the partition support is bent when viewed in plan view to cover a plurality of the step portions in the plurality of three-dimensional crossing portions.

* * * * *